(12) United States Patent
Jiang et al.

(10) Patent No.: US 7,013,088 B1
(45) Date of Patent: Mar. 14, 2006

(54) METHOD AND APPARATUS FOR PARALLEL OPTICAL INTERCONNECTION OF FIBER OPTIC TRANSMITTERS, RECEIVERS AND TRANSCEIVERS

(75) Inventors: Wenbin Jiang, Thousand Oaks, CA (US); Hsing-Chung Lee, Calabasas, CA (US); Min-Wen Cheng, Torrance, CA (US); Chan-Long Shieh, Paradise Valley, AZ (US); Cheng Ping Wei, Gilbert, AZ (US); Edwin D. Dair, Los Angeles, CA (US)

(73) Assignee: JDS Uniphase Corporation, San Jose, CA (US)

(*) Notice: Subject to any disclaimer, the term of this patent is extended or adjusted under 35 U.S.C. 154(b) by 626 days.

(21) Appl. No.: 09/651,140

(22) Filed: Aug. 30, 2000

Related U.S. Application Data (63) Continuation-in-part of application No. 09/321,308, filed on May 27, 1999, now Pat. No. 6,901,221, and a continuation-in-part of application No. 09/320,409, filed on May 26, 1999, now Pat. No. 6,213,651.

(51) Int. Cl.
*H04B 10/00* (2006.01)
(52) U.S. Cl. ............................ 398/139; 385/88; 385/92
(58) Field of Classification Search ................ 398/135, 398/138, 139, 182, 202; 385/14, 88, 92
See application file for complete search history.

(56) References Cited

U.S. PATENT DOCUMENTS

| | | | |
|---|---|---|---|
| 3,792,284 A | 2/1974 | Kaelin | |
| 3,809,908 A | 5/1974 | Clanton | |
| 3,870,396 A | 3/1975 | Racki et al. | |
| 3,976,877 A | 8/1976 | Thillays | |
| 4,149,072 A | 4/1979 | Smith et al. | |
| 4,161,650 A | 7/1979 | Caouette et al. | |
| 4,178,051 A | * 12/1979 | Kocher et al. | ............... 439/157 |
| 4,229,067 A | 10/1980 | Love | |
| 4,273,413 A | 6/1981 | Bendikens et al. | |
| 4,347,655 A | 9/1982 | Zory et al. | |

(Continued)

FOREIGN PATENT DOCUMENTS

EP        0 652 696 A1      11/1994

OTHER PUBLICATIONS

Buczynski, et al., Fast Optical Thresholding with an Array of Optoelectronic Transceiver Elements, IEEE Photonics Technology Letters, vol. 11, No. 3, Mar. 1999.

(Continued)

*Primary Examiner*—Agustin Bello
(74) *Attorney, Agent, or Firm*—Allen, Dyer, Doppelt, Milbrath & Gilchrist, P.A.

(57) ABSTRACT

A multichannel fiber optic module has an electromagnetic shield surrounding high frequency electrical components which is electrically and mechanically coupled to one or more guide rails near edges of a printed circuit board. The one or more guide rails of the printed circuit board include a ground trace on the top and/or bottom surfaces of the printed circuit board. The fiber optic module can be hot inserted into a module cage which has guide rail slots for mating with the guide rails of the fiber optic module. Through the guide rail slots, electromagnetic radiation from the fiber optic module is shunted to a ground plane to which the module cage is coupled on a host chassis ground. Standard singular fiber receptacles are used for the parallel data link modules to allow field cable termination.

23 Claims, 7 Drawing Sheets

U.S. PATENT DOCUMENTS

| | | |
|---|---|---|
| 4,432,604 A | 2/1984 | Schwab |
| 4,446,515 A | 5/1984 | Sauer et al. |
| 4,449,244 A | 5/1984 | Kopainsky |
| 4,461,537 A | 7/1984 | Raymer, II et al. |
| 4,493,113 A | 1/1985 | Forrest et al. |
| 4,533,209 A | 8/1985 | Segerson et al. |
| 4,534,616 A | 8/1985 | Bowen et al. |
| 4,535,233 A | 8/1985 | Abraham |
| 4,539,476 A | 9/1985 | Donuma et al. |
| 4,542,076 A | 9/1985 | Bednarz et al. |
| 4,549,782 A | 10/1985 | Miller |
| 4,549,783 A | 10/1985 | Schmachtenberg, III |
| 4,553,811 A | 11/1985 | Becker et al. |
| 4,580,295 A | 4/1986 | Richman |
| 4,595,839 A | 6/1986 | Braun et al. |
| 4,612,670 A | 9/1986 | Henderson |
| 4,625,333 A | 11/1986 | Takezawa et al. |
| 4,647,148 A | 3/1987 | Katagiri |
| 4,678,264 A | 7/1987 | Bowen et al. |
| 4,720,630 A | 1/1988 | Takeuchi et al. |
| 4,727,248 A | 2/1988 | Meur et al. |
| 4,807,955 A | 2/1989 | Ashman et al. |
| 4,840,451 A | 6/1989 | Sampson et al. |
| 4,844,581 A | 7/1989 | Turner |
| 4,856,091 A | 8/1989 | Taska |
| 4,881,789 A | 11/1989 | Levinson |
| 4,897,711 A | 1/1990 | Blonder et al. |
| 4,912,521 A | 3/1990 | Almquist et al. |
| 4,913,511 A | 4/1990 | Tabalba et al. |
| 4,945,229 A | 7/1990 | Daly et al. |
| 4,979,787 A | 12/1990 | Lichtenberger |
| 4,986,625 A | 1/1991 | Yamada et al. |
| 4,989,934 A | 2/1991 | Zavracky et al. |
| 5,005,939 A * | 4/1991 | Arvanitakis et al. .......... 385/53 |
| 5,011,246 A | 4/1991 | Corradetti et al. |
| 5,039,194 A | 8/1991 | Block et al. |
| 5,039,199 A | 8/1991 | Mollenauer et al. ........ 359/334 |
| 5,043,775 A | 8/1991 | Lee |
| 5,093,879 A | 3/1992 | Bregman et al. |
| 5,099,307 A | 3/1992 | Go et al. |
| 5,104,243 A | 4/1992 | Harding |
| 5,109,453 A | 4/1992 | Edwards et al. |
| 5,109,454 A | 4/1992 | Okuno et al. |
| 5,117,476 A * | 5/1992 | Yingst et al. ................. 385/88 |
| 5,122,893 A | 6/1992 | Tolbert |
| 5,136,152 A | 8/1992 | Lee |
| 5,155,786 A | 10/1992 | Ecker et al. |
| 5,159,190 A | 10/1992 | Hohberg et al. |
| 5,168,537 A | 12/1992 | Rajasekharan et al. |
| 5,202,943 A | 4/1993 | Carden et al. |
| 5,225,922 A | 7/1993 | Chraplyvy et al. ......... 359/124 |
| 5,241,614 A | 8/1993 | Ecker et al. |
| 5,259,054 A | 11/1993 | Benzoni et al. |
| 5,280,191 A | 1/1994 | Chang |
| 5,285,512 A | 2/1994 | Duncan et al. |
| 5,289,345 A | 2/1994 | Corradetti et al. |
| 5,295,214 A | 3/1994 | Card et al. |
| 5,337,391 A | 8/1994 | Lebby |
| 5,337,396 A * | 8/1994 | Chen et al. ................... 385/92 |
| 5,337,398 A | 8/1994 | Benzoni et al. |
| 5,345,524 A | 9/1994 | Lebby et al. |
| 5,361,244 A | 11/1994 | Nakamura et al. |
| 5,406,404 A | 4/1995 | DiGiovanni et al. ........ 359/161 |
| 5,414,787 A | 5/1995 | Kurata |
| 5,416,668 A | 5/1995 | Benzoni |
| 5,416,870 A | 5/1995 | Chun et al. |
| 5,416,871 A | 5/1995 | Takahashi et al. |
| 5,416,872 A | 5/1995 | Sizer, II et al. |
| 5,428,704 A | 6/1995 | Lebby et al. |
| 5,432,630 A | 7/1995 | Lebby et al. |
| 5,434,747 A | 7/1995 | Shibata |
| 5,446,814 A | 8/1995 | Kuo et al. |
| 5,452,387 A | 9/1995 | Chun et al. |
| 5,455,703 A | 10/1995 | Duncan et al. |
| 5,473,715 A | 12/1995 | Schofield et al. |
| 5,475,783 A | 12/1995 | Kurashima |
| 5,482,658 A | 1/1996 | Lebby et al. |
| 5,499,311 A | 3/1996 | DeCusatis |
| 5,499,312 A | 3/1996 | Hahn et al. |
| 5,515,468 A | 5/1996 | DeAndrea et al. |
| 5,528,408 A | 6/1996 | McGinley et al. |
| 5,535,296 A | 7/1996 | Uchida |
| 5,546,281 A | 8/1996 | Poplawski et al. |
| 5,548,677 A | 8/1996 | Kakii et al. |
| 5,550,941 A | 8/1996 | Lebby et al. |
| 5,561,727 A | 10/1996 | Akita et al. |
| 5,596,663 A | 1/1997 | Ishibashi et al. |
| 5,636,298 A | 6/1997 | Jiang et al. |
| 5,687,267 A | 11/1997 | Uchida |
| 5,708,743 A | 1/1998 | DeAndrea et al. |
| 5,717,533 A | 2/1998 | Poplawski et al. |
| 5,734,558 A | 3/1998 | Poplawski et al. |
| 5,736,782 A | 4/1998 | Schairer |
| 5,751,471 A | 5/1998 | Chen et al. |
| 5,767,999 A | 6/1998 | Kayner |
| 5,774,614 A | 6/1998 | Gilliland et al. |
| 5,778,127 A | 7/1998 | Gilliland et al. |
| 5,812,582 A | 9/1998 | Gilliland et al. |
| 5,812,717 A | 9/1998 | Gilliland et al. |
| 5,847,862 A | 12/1998 | Chraplyvy et al. ......... 359/164 |
| 5,864,468 A | 1/1999 | Popllawski et al. |
| 5,879,173 A | 3/1999 | Poplawski et al. |
| 5,883,736 A | 3/1999 | Oshima et al. ............. 359/341 |
| 5,959,750 A | 9/1999 | Eskildsen et al. ........... 359/134 |
| 6,024,500 A | 2/2000 | Wolf |
| 6,038,356 A | 3/2000 | Kerfoot, III et al. .......... 385/24 |
| 6,040,933 A | 3/2000 | Khaleghi et al. ........... 359/124 |
| 6,052,219 A | 4/2000 | Kidorf et al. ............... 359/334 |
| 6,061,493 A | 5/2000 | Gilliland et al. |
| 6,071,017 A | 6/2000 | Gilliland et al. |
| 6,088,152 A | 7/2000 | Berger et al. ............... 359/334 |
| RE36,820 E | 8/2000 | McGinley et al. |
| 6,115,174 A | 9/2000 | Grubb et al. ............... 359/334 |
| 6,175,727 B1 * | 1/2001 | Mostov ...................... 455/307 |
| 6,179,627 B1 * | 1/2001 | Daly et al. ................. 439/76.1 |
| 6,213,651 B1 | 4/2001 | Jiang et al. |
| 6,369,924 B1 | 4/2002 | Scharf et al. |
| 6,457,875 B1 | 10/2002 | Kropp et al. |
| 6,581,830 B1 * | 6/2003 | Jelinek et al. .............. 235/441 |

OTHER PUBLICATIONS

Heinrich, et al., Low-Cost VCSEL-Transceiver Module for Optical Data Busses, IEEE, 1997.

Rosinski, et al., Multichannel Transmission of a Multicore Fiber Coupled with Vertical-Cavity Surface-Emitting Lasers, Journal of Lightwave Tech., vol. 17, No. 5, May 1999.

Crow, et al., The Jitney Parallel Optical Interconnect, 1996 Electronic Components and Technology Conference.

A. M. Hill, et al., "Nonlinear Crosstalk Due to Stimulated Raman Scattering in a Two-Channel Wavelength-Division-Multiplexed System", Electronics Letters, vol. 20, No. 6, 1984.

R.T. Chen and P.S. Gulfoyle (Eds.) Optoelectronic Interconnects and Packaging, Critical Reviews, vol. CR62 (1996), pp. 48-63, 64-67, 229-243, 393-404, 405-414, 442-460, Spic Optical Engineering Press, Washington.

R.G. Hunsperger, Integrated Optics: Theory and Technology (2nd Ed.), 1985, pp. 89-106, 236-245, Springer-Verlag Berlin Heidelberg, Germany.

A. Chatak and K. Thyagarajan, Introduction to Fiber Optics, 1998, pp. 411-413, 447-449, 467-473, Cambridge University Press, United Kingdom.

R.C. Dorf, Electrical Engineering Handbook, 1993, pp. 1682-1684, CRC Press, Inc., Florida.

* cited by examiner

FIG. 5A

METHOD AND APPARATUS FOR PARALLEL OPTICAL INTERCONNECTION OF FIBER OPTIC TRANSMITTERS, RECEIVERS AND TRANSCEIVERS

CROSS REFERENCE TO RELATED APPLICATION

This application claims the benefit and is a continuation-in-part of U.S. patent application Ser. No. 09/321,308, filed on May 27, 1999 now U.S. Pat. No. 6,901,221 by Wenbin Jiang et al. which is hereby incorporated by reference and also claims the benefit of and is a continuation-in-part of U.S. patent application Ser. No. 09/320,409, filed on May 26, 1999 now U.S. Pat. No. 6,213,651 by Wenbin Jiang et al. which is hereby incorporated by reference, both of which are to be assigned to E2O Communications, Inc.

FIELD OF THE INVENTION

This invention relates generally to light coupling devices. More particularly, the invention relates to fiber optic modules.

BACKGROUND OF THE INVENTION

Fiber optic modules interface optical fibers to electronic circuitry transducing communication by light or photons with communication by electrical signals. A fiber optic module may be a fiber optic receiver, transmitter or transceiver including both receive and transmit functions. The fiber optic receiver, transmitter and transceiver each have optical elements (OE) and electrical elements (EE). The fiber optic transmitter OE includes an emitter (such as a semiconductor LED or Laser) mounted in a package and an optical coupling element for coupling light or photons from the OE into the optical fiber. The type of semiconductor laser (light amplification by stimulated emission of radiation) may be a vertical cavity surface emitting laser (VCSEL). The fiber optic receiver OE includes a photodetector (such as a photodiode) mounted in a package and an optical coupling element for coupling light or photons from the optical fiber into the photodetector. The EE for each includes integrated circuits, other active elements and passive elements mounted on a substrate such as a printed circuit board (PCB) or ceramic. The OE and EE are connected electrically at the emitter and photodetector.

Because of the high modulation frequencies utilized in fiber optic communication, crosstalk between receive and transmit signals and electromagnetic interference (EMI) is of concern. In order to reduce EMI, shielding of the high frequency electrical components is required which is usually accomplished by attaching a metal shield to the substrate of the fiber optic module and connecting it to ground. Rapidly increasing internet traffic has created a demand for low cost fiber optic devices with bandwidth capabilities up to 40 Gigabytes per second (Gbps) for distances up to 300 meters without sacrificing the quality of the fiber optic link. In order to meet the bandwidth demands, it is desirable to provide parallel fiber optic data links with four, ten or twelve channel VCSEL arrays each operating at 1.25 gigabytes per second (Gbps), 2.5 Gbps or up to 10 Gbps. Each VCSEL in the VCSEL array is, spaced apart at 250 $\mu$m and coupled in parallel to a fiber optic ribbon cable. Such small spacing between each VCSEL in a VCSEL array allows for compact packaging of a VCSEL array which can be used in a multiple channel laser transmitter or transceiver. However, the tightly packed VCSELs in the VCSEL array having such small spacing there between introduces some challenges. One challenge which is difficult to overcome is separately monitoring the output power of each VCSEL in the VCSEL array when they are so tightly spaced and packaged together.

To maintain the quality of multiple channels providing multiple fiber optic data links, monitoring the output power of each individual VCSEL is important in order to assure signal quality. It is desirable to maintain a constant output power over temperature variations and time. To maintain a constant output power, each individual VCSELs operation needs to be separately monitored and optimized over time due to temperature variations, aging, and other effects. Additionally, the close spacing of the VCSELs in a VCSEL array aggravates the difficulty of placing EE components and interconnections on a printed circuit board. Additionally, the close spacing of VCSELs in the VCSEL array complicates any optical alignment needed between EE and OE components and the fiber optic cable. A VCSEL array necessitates five dimensional alignment between the EE and the OE in the X, Y, Z axes and along the axes of rotation and of tilt for each VCSEL in the VCSEL array. To provide five dimensional alignment, expensive packaging and packaging tools are required.

Another disadvantage to VCSEL arrays is that power output is highly localized due to the tightly spaced VCSELs in the VCSEL arrays. Combining the output power of all the VCSELs in the VCSEL array, the combined output power exceeds IEC Class-1 eye safety limit. This necessitates the special handling of the data link modules when powering the VCSEL array such as when plugging it into a printed circuit board. Otherwise, harm may result to a user's eyes if the user accidentally looks into the laser beams from the VCSEL array.

For commercial acceptance, fiber optic modules generally must comply with existing industry standards such as the Hot pluggable Gigabit Interface Converter (GBIC) de facto industry standard. The details of the GBIC standard are set forth in SFF Committee Proposed Specification for GBIC (Gigabit Interface Converter), Rev. 5.4, Aug. 16, 1999, the disclosure of which is incorporated herein by reference. Because of the relatively large size of GBICs, end users desire more compact, high throughput fiber optic transceivers. Particularly, end users desire a GBIC in a small form pluggable (SFP), LC package.

It is desirable to improve upon the prior art. There is a need to support high bandwidth links whose output power can be monitored and optimized over temperature variations and time, while overcoming EMI and eye safety concerns. There is a need to provide simplified alignment in a multi-channel fiber optic module to reduce costs. Moreover, there is a need for fiber optic modules meeting these needs, yet still conforming to industry standards.

BRIEF SUMMARY OF THE INVENTION

Briefly, the present invention includes a method, apparatus and system as described in the claims.

Parallel fiber optic transmitter and receiver channels are implemented within a fiber optic module having LC connectors or other small form factor connectors. The fiber optic module is implemented with an optical element and an electrical element. The fiber optic module includes a printed circuit board (PCB) having one or more edges that serve as guide rails that can electrically and mechanically couple to one or more guide rail slots of a module cage. The module cage formed of a conductive material has the one or more guide rail slot which in themselves are conductive to electrically and mechanically couple to the one or more guide rails of the fiber optic module. The metallized module housing provides an internal electromagnetic interference shield which is coupled to the guide rail slot of a module cage and a ground plane of a host or daughter card printed circuit board (PCB) as well as to a chassis ground. The grounding to the chassis is achieved by the module cage tabs which protrude from the cage housing and can electrically couple the internal electromagnetic interference shield and the one or more guide rail slots to the chassis ground. The cage is therefore in contact directly with the system chassis both mechanically and electrically for grounding. The arrangement allows fiber optic module to "hot plug" or be physically inserted and withdrawn during system operation without causing damage to either the fiber optic module or the system.

Alternatively, when a hot plug-in application is not required, the fiber optic module can be in fixed electrical interface format where the fiber optic module is directly soldered onto the daughter card or the system circuit board without the use of any cage. The fiber optical module grounding is provided by electrical contact directly with the grounding plane of the daughter card or the system circuit card through electrical interfaces of the fiber optical module.

The fiber optic module supports multiple combinations of fiber optic channels for transmitting, receiving or transceiving signals. The fiber optic module housing and the cage for the module may be formed of a conductive material such as a metal or include conductive plating to provide the conductive guide rail slots, and tabs for internal EMI shielding and allowing the module to be hot plugged into the cage. Additionally, fiber optic connectors besides LC connectors may be used such as SC, MT-RJ, or MU connectors to provide an optical interface of the module to the fibers.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention includes a method, apparatus and system for parallel optical interconnection of fiber optic transmitters, receivers, and/or transceivers.

Figure 1A:
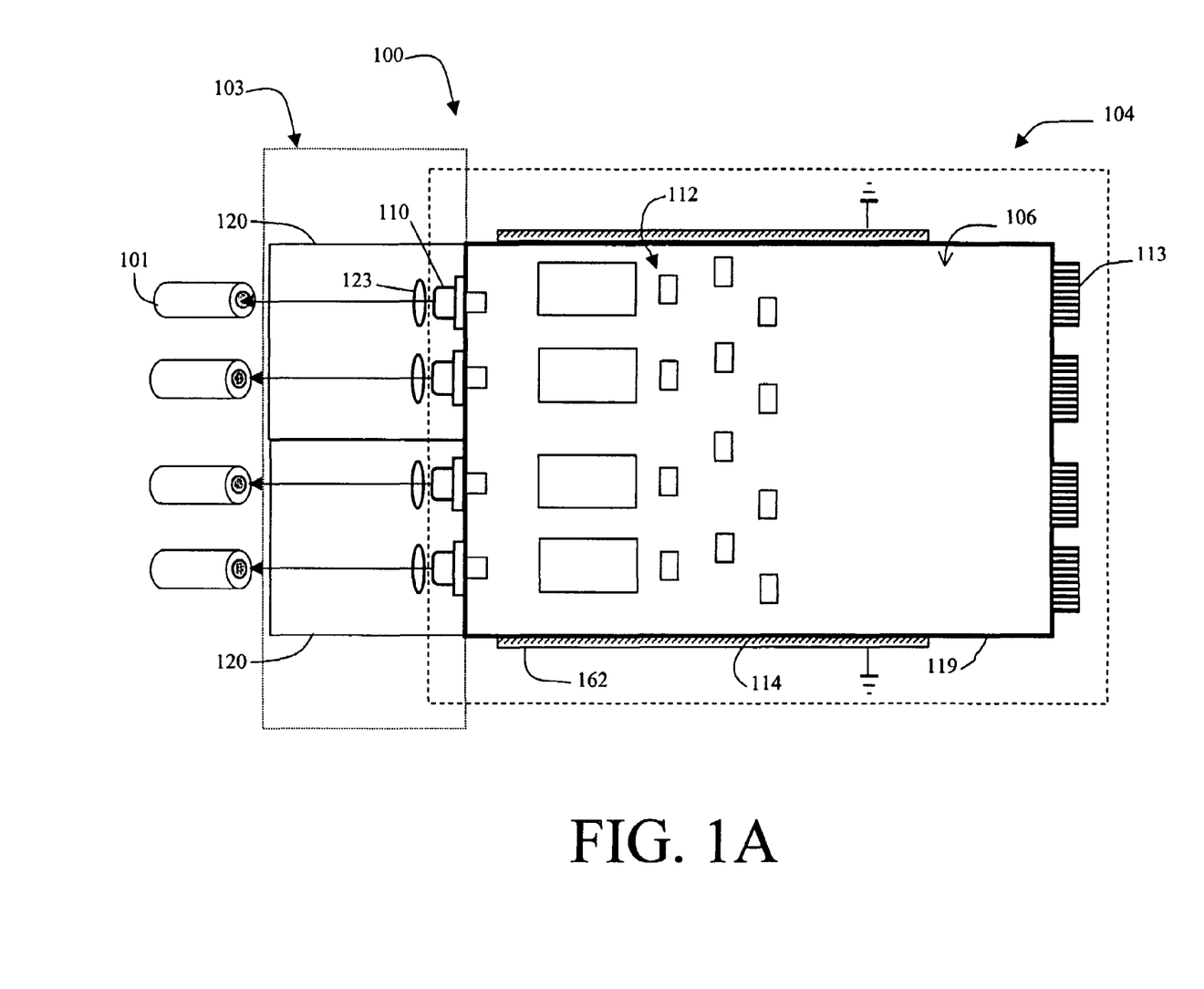
FIG. 1A is a simplified top cutaway view of a fiber optic module for an embodiment of the present invention.

Referring now to FIG. 1A, a simplified cutaway view of a first embodiment of the present invention is illustrated. FIG. 1A illustrates a fiber optic module 100 (a fiber optic transmitter, receiver, or transceiver module) for coupling to a plurality of fiber optic cables 101. The fiber optic cable 101 may be individual cables or a ribbon cable. Fiber optic module 100 includes an optical element 103 and an electrical element 104. The electrical element 104 includes a printed circuit board (PCB) 106, a plurality of light transmitters 110 (i.e. emitters) or a plurality of light receivers 111 (i.e. photodetectors—shown on FIG. 1B.

Figure 1B:
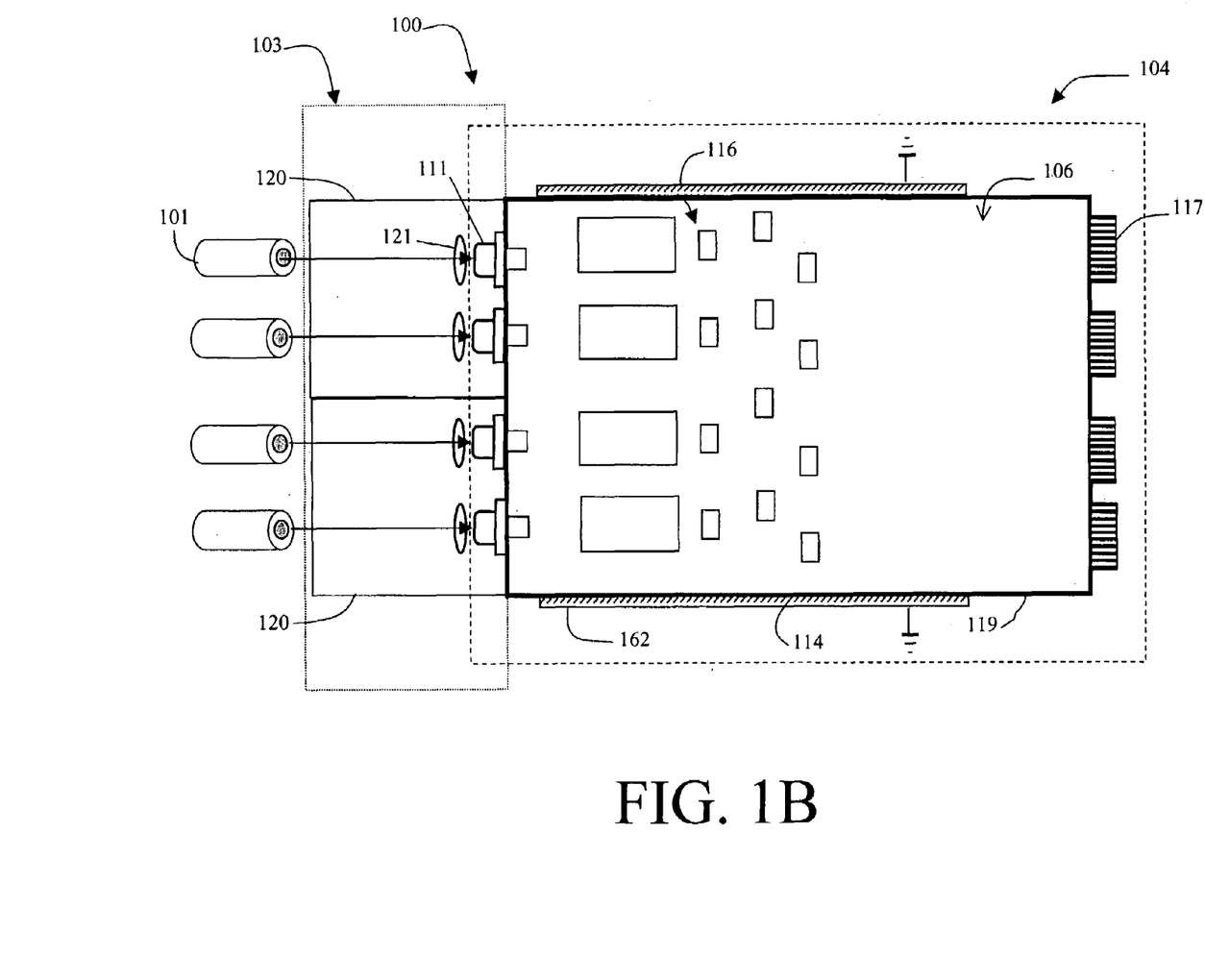
FIG. 1B is a simplified top cutaway view of a fiber optic module for another embodiment of the present invention.

The light transmitters 110 or receivers 111 are optoelectronic devices for communicating with optical fibers using light of various wavelengths or photons. An optoelectronic device is a device which can convert or transduce light or photons into an electrical signal or an electrical signal into light or photons. In the case of transmitters, the light transmitters 110 are packaged emitters that convert electrical signals into emitting light or photons, such as semiconductor lasers (i.e. a VCSEL) or LED, may be packaged in TO (transistor outline) cans. In the case of receivers, the receivers 111 are packaged photodetectors, that detect or receive light or photons and convert it into an electrical signal, such as a photo diode, may be packaged in a TO can. However other packages, housings or optoelectronic devices for receiving and transmitting light or photons may be used for the light transmitters 110 or receivers 111.

The shielded housing 119 has a top portion 119A and a bottom portion 119B that couple together and to the PCB 106. The top 119A and bottom portions 119B of the shielded housing 119 when properly assembled together sandwich the PCB 106 and encompass all high frequency electrical components while allowing the edges of the PCB 106 to extend outward outside of it to form the guide rails 162. Shielded housing 119 (and top portion 119A and bottom portion 119B) may be a metallized casing.

Each of the optoelectronic devices, transmitters 110 or receivers 111, have terminals to couple to traces or thruholes of the PCB 106. The PCB 106 includes electrical components 112 or 116 (transmitter integrated circuit (laser driver), or receiver integrated circuit (transimpedance amplifier and post amplifier), resistors, capacitors and other passive or active electrical components), male electrical connectors 113, and a ground plane 114. Electrical components 112 and 116 may be packaged with fixed PGA (pin grid array), fixed BGA (ball grid array), or other packaging technologies well known in the art. The ground plane 114 is exposed on the top and/or bottom surface near one or more edges of the PCB 106 external to the shielded housing 119 to form the guide rails 162. In FIG. 1, the ground plane is exposed near the edges of the left and right sides of the PCB 106. The exposed portion of ground plane 114 is a conductive surface such as a metallized surface formed of copper, silver, gold or other metal or alloy. The ground plane 114 preferably couples to ground or a low level of a power supply through the exposed top or bottom conductive surface of the guide rails 162 near the edges of the PCB 106. Shielded housing 119 is coupled to ground plane 114.

Figure 5A:
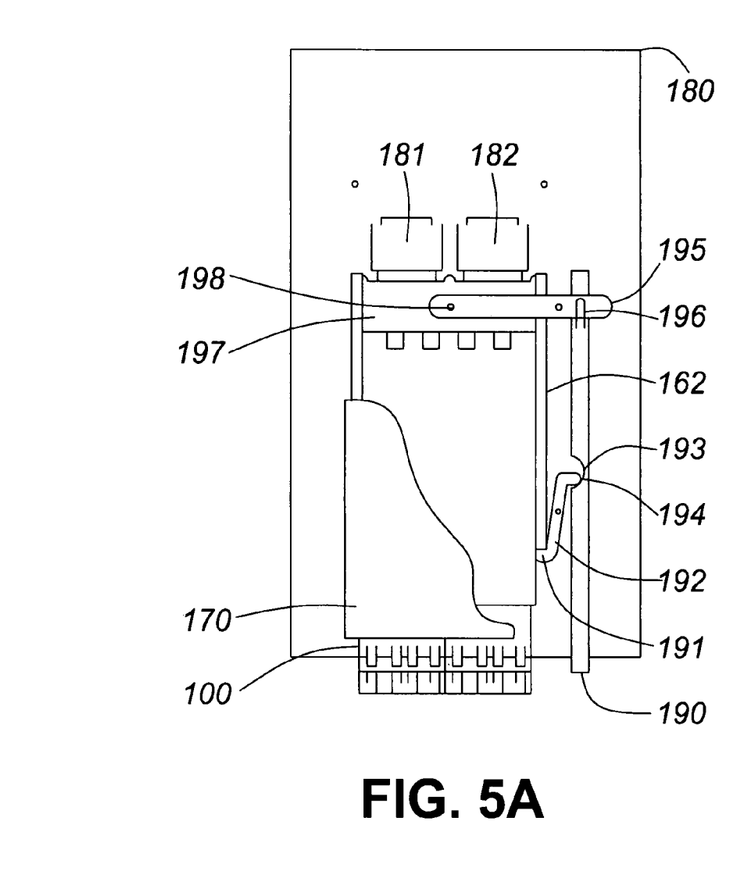
FIG. 5A is a top view of a locking mechanism of the present invention in a locked position to couple the fiber optic module, the module cage, and the host PCB together.

At least one pin of the male electrical connectors 113 and 117 couple to the female electrical connectors 181 and 182

(shown in FIG. 5) respectively when the fiber optic module 100 is inserted. The female electrical connectors 181 may be SFP (Small Form Pluggable) SMT (Surface Mount Technology) connectors. One or more pins of the male electrical connectors 113 and 117 allow electrical signals, power, and ground to be coupled into or out of the PCB 106.

A female electrical connector 181, pins of a male electrical connector 113, electrical components 112 necessary for controlling one light transmitter 110, a transmitter 110 and a lens 123 of the optical block form one transmitting channel. The electrical components 112 control the transmitter 110 and buffer the data signal received from a system for transmission over an optical fiber. A female electrical connector 182, pins of a male electrical connector 117, electrical components 116 necessary for controlling one light receiver 111, a light receiver 111 and a lens 121 of the optical block form one receiving channel. Other combinations of components can form other communications channels. The electrical components 116 control the receiver 111 and buffer the data signal received from an optical fiber. The individual electrical components 112 and 116 of each channel allows the optical output power to be automatically controlled at each of the channels individually.

The shielded housing 119 of the fiber optic module 100 shunts electromagnetic fields to ground to avoid electromagnetic interference (EMI) generated by other external devices and the electrical components inside the housing.

Additional communication channels can be readily added to the fiber optic module 100. PCB 106 may be enlarged along with the ground plane 114 to include additional transmit or receive communication channels, each channel having a separate transmitter 111 or receiver 110 with the shielded housing 119 encompassing all high frequency electrical components of the communication channels to provide EMI shielding. To reduce the size of the PCB 106 or to incorporate more functions on the PCB 106, a multi-channel IC may also be employed instead of discrete ICs for each communication channel. The number of male electrical connectors 113 and 117 may be reduced to make the electrical interface more compact. For instance, only one male electrical connector 113 and one male electrical connector 117 may be employed. Furthermore, male electrical connector 113 and male electrical connector 117 may be combined into one male electrical connector. Also, the grouping of multiple transmit or receive communication channels on a PCB 106 allows the use of a common power supply for those transmit or receive communication channels. Thus, the module may be further simplified, reduced in size, and made less expensive to manufacture. Furthermore, multiple fiber optic modules 100 may be designed to plug in side by side to form a single fiber optic module having additional communication channels.

Thus, by grouping four transmit communication channels on a PCB 106 a four channel transmitter may be assembled. Likewise, by grouping four receive communication channels on a PCB 106 a four channel receiver may be assembled. By grouping four transmit communication channels and four receive communication channels on a PCB 106 a four channel transceiver may be assembled. Eight channel, ten channel, twelve channel, sixteen channel, twenty-four channel, thirty-two channel and other sizes of transmitters, receivers and transceivers are thus possible.

Figure 2:
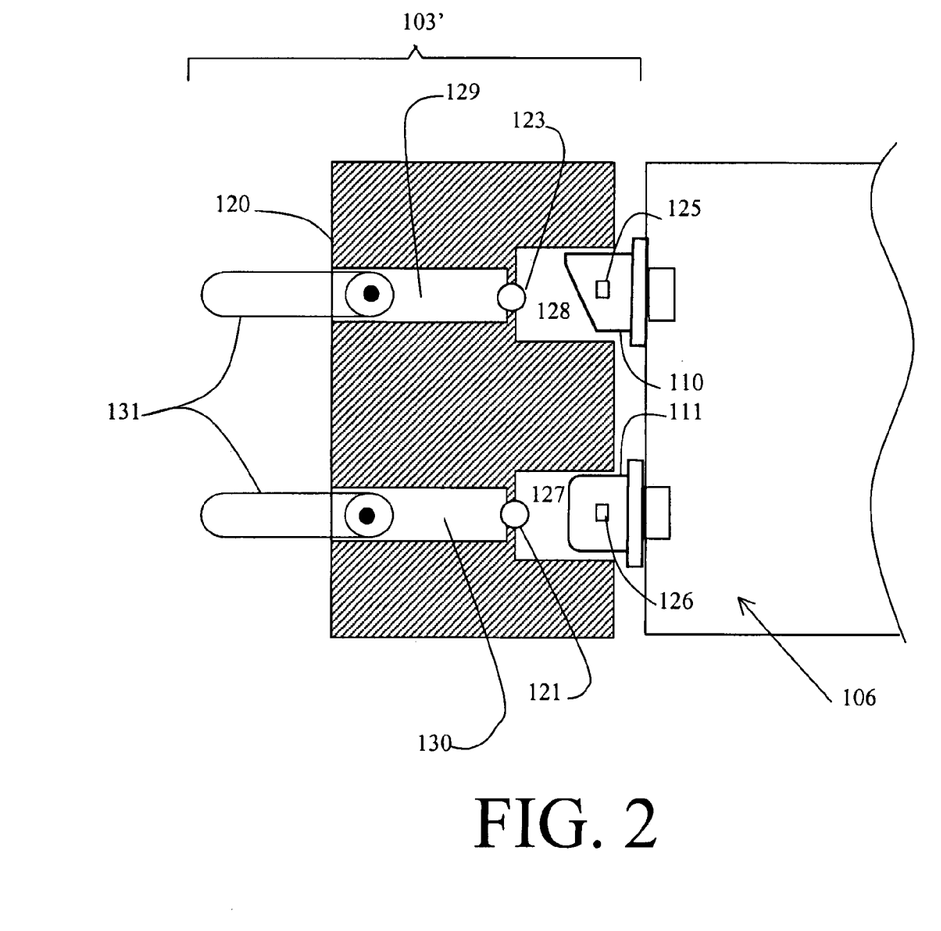
FIG. 2 is a simplified top cross-sectional view illustrating an optical element OE for an embodiment of the present invention.

Referring now to FIG. 2, a simplified cross-sectional view of an optical subassembly 103' of the fiber optic element 103 is illustrated. Optical element 103 has at least one optical subassembly 103'. The optical subassembly 103' includes an optical block 120 and fiber ferules 131. The optical block 120 includes a lens 123 and a lens 121 for coupling light or photons into or out of the fiber optic cable 101. Lens 123 and 121 may be spherical lenses or each may be a pair of aspheric lenses on the same optical axis. Light or photons emitted by a transmitter 110 are collected and focused by lens 123 into a transmit fiber optic cable. Light or photons on a receive fiber optic cable are collected and focused by lens 121 into a receiver 111.

The transmitter 110 and the receiver 111 are aligned and coupled to the optical block 120 in the openings 128 and 127 respectively. The transmitter 110 includes an emitter 125 for generation of light or photons. The receiver 111 includes a detector 126 to receive light or photons. Light or photons emitted by the emitter 125 are coupled into lens 123, collected and focused into the optical fiber through the optical port 129. Light or photons, incident from a fiber optic cable coupled to the fiber optic module 100, is received through the optical port 130. Photons from the fiber optic cable are incident upon the lens 121. Lens 121 collects and focuses the incident light or photons from the fiber optic cable onto the detector 126 of the receiver 111. In order to keep the optical fibers 101 in alignment with the optical block 120, the fiber ferrules 131 are provided. The fiber ferrules 131 are inserted into the optical ports 129 and 130 of the optical block 120. While a light transmitter 110 and light receiver 110 are illustrated, optical subassembly 103' may include two light transmitters or two light receivers 111. The optical element 103 includes a plurality of optical blocks 120 coupled to one or more EEs 104 to form fiber optic modules with various numbers of channels of various types (i.e. transmit, receive, or transceive combinations).

Figure 3:
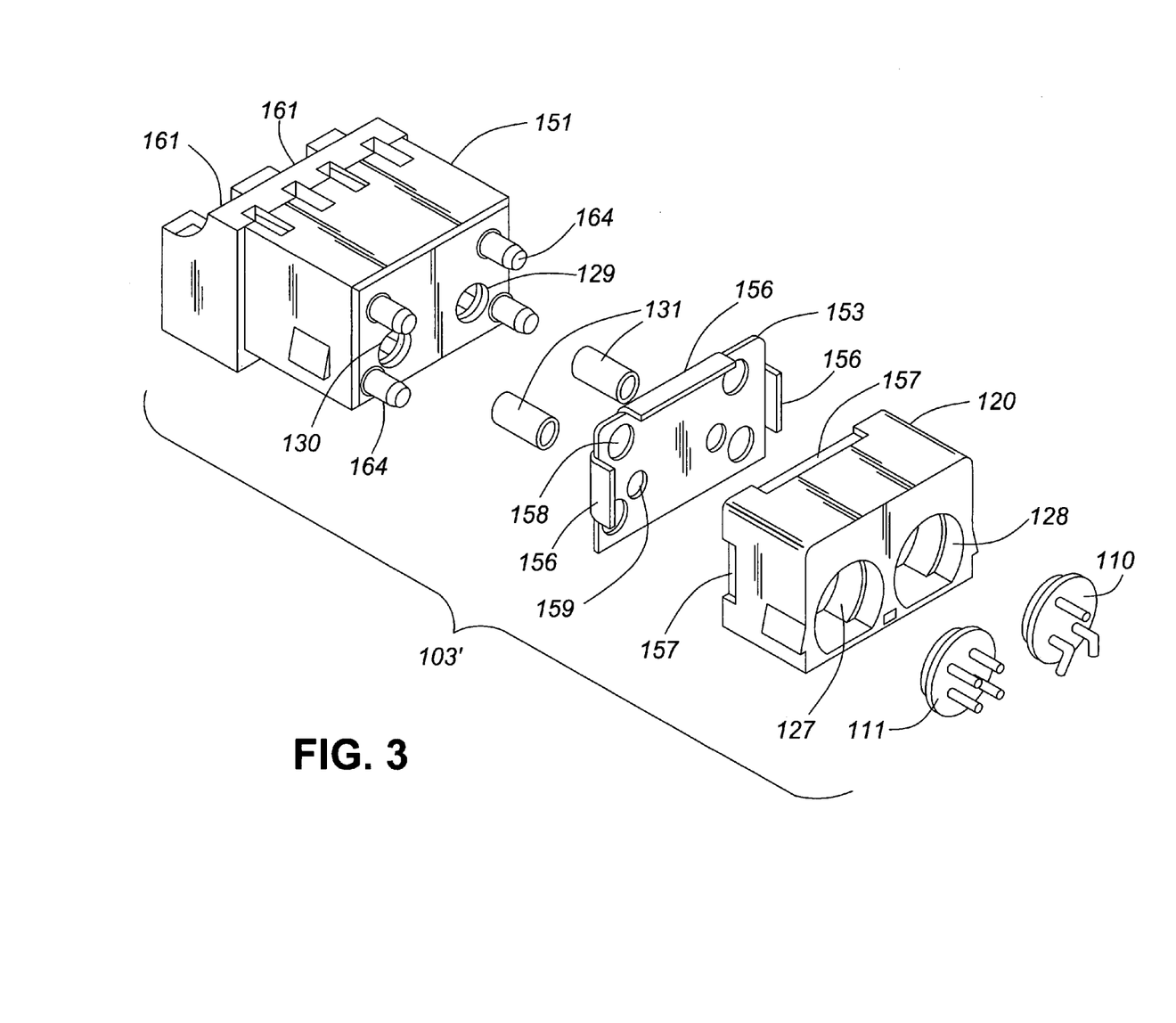
FIG. 3 is an exploded view of the optical block of the optical element for a preferred embodiment of the present invention.
Figure 4A:
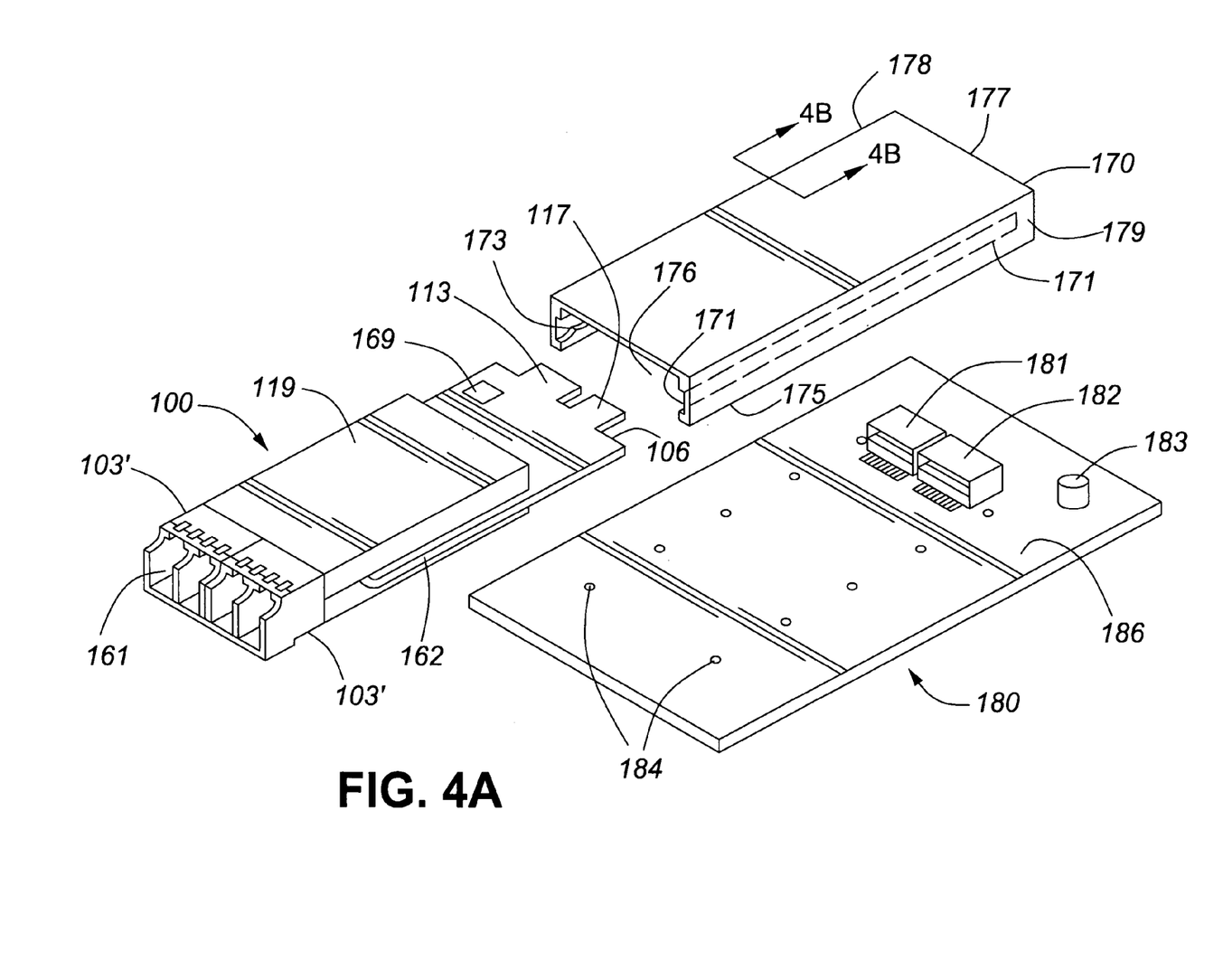
FIG. 4A is an exploded view of the fiber optic module, module cage, and host PCB of the present invention.

Referring now to FIG. 4A, a disassembled view of the fiber optic (transmit/receive) module 100, a module cage 170, and a host printed circuit board (PCB) 180 of an embodiment of the present invention is illustrated. The fiber optic module (transmit/receive) 100 has a pair of optical subassemblies 103', as in FIG. 3, with two optical blocks 120 each having two LC receptacles 161 for coupling to fiber optic cables 101. A four-channel LC receptacle optical block can be used instead of using two duplex LC receptacle blocks. The fiber optic module 100 also includes guide rails 162 on opposite sides of the PCB 106 as shown. In the preferred embodiment, the guide rails 162 are at edges of PCB 106 and include an exposed conductive portion of the ground plane 114 on top and/or bottom surfaces of the edge of the PCB 106 which extend outside the shielded housing 119.

Note that more than two channels can be formed in parallel together by providing additional optical subassemblies 103' and electrical elements 104 with additional components, or by expanding the dual channel optical block to four channel, eight channel, ten channel, twelve channel optical blocks or more. Depending on the number of channels thus created, different configurations of fiber optic cables 101 may be employed. For example, for a four channel assembly two duplex LC fiber optic cables, four LC cables, four bundled LC cables or one four channel parallel ribbon with fan out LC connectors may be employed.

Nose 151 has a pair of LC receptacles 161 for mechanically coupling and aligning a pair of LC terminated fiber optic cables 101 into the fiber optic module 100. Each LC receptacle 161 shown is a fiber optic receptacle for one single direction fiber optic channel. The LC receptacles 161 in the nose 151 are preferably located without spacing between each other. Due to the separation of the neighboring channels, the fiber optic module 100 having multiple channels can comply with FDA and IEC Class-1 eye safety limits. This allows easier handling of the fiber optic module 100.

Due to the size of LC connectors, TO-can size packages are usable which allows the output power level of each individual fiber optic channel to be separately monitored. Monitoring a fiber optic channel involves splitting the light beam so that a photodetector or photodiode receives a portion of the light beam. The electrical output of the photodiode is then measured to indicate the output power level of the fiber optic channel. The relaxed spacing of the individual fiber optic connectors of the present invention facilitate placing light beam splitters within the TO can of the transmitter 110. The light beam splitter splits the beam such that a portion of the light beam lands on a photodiode within the TO can. The photodiode's output is measured to monitor the output power of the transmitter.

Thus, with each channel being separately monitored for power output, each channel can be individually optimized similar to the manner in which single channel data links are optimized. Therefore, a fiber optic module with parallel channels and separate power output monitoring such as this, can have superior performance with respect to the extinction ratio, jitter, aging and temperature compensation.

The use of multiple LC connectors in the present invention can reduce cabling costs, especially in the cable termination cost. It also allows field termination while other alternative technology, such as the use of MPO/MTP connectors for the parallel data links, cannot be terminated in the field, and pre-termination cabling increase the cost of fiber cable installation. There are also larger installed base and volume to support discrete termination connectors like LC than MPO/MTP connectors. Those skilled in the art will also recognize that other fiber optic connectors such as, but not limited to, SC, MT-RJ, VF45, and MU connectors, may be used in lieu of the LC connectors 161.

Referring now to FIG. 4A, a disassembled view of the fiber optic (transmit/receive) module 100, a module cage 170, and a host printed circuit board (PCB) 180 of an embodiment of the present invention is illustrated. The fiber optic module (transmit/receive) module 100 has two optical blocks 102 each having two LC receptacles 161 for coupling to fiber optic cables 101. A four-channel LC receptacle optical block can be used instead of using two duplex LC receptacle blocks. The fiber optic module 100 also includes guide rails 162 on opposite sides of the PCB 106 as shown. In the preferred embodiment, the guide rails 162 are at edges of PCB 106 and include an exposed conductive portion of the ground plane 114 on top and/or bottom surfaces of the edge of the PCB 106 which extend outside the shielded housing 119.

The module cage 170 is formed of a conductive material such as a metal and mounts to the host PCB 180. The cage is grounded through a spring-pin tabs, not shown in FIG. 4A, to the chassis ground to shunt electromagnetic fields. To facilitate the assembly of the cage to the host PCB 180, tabs 175 of the module cage 170 may be snapped into or soldered onto the PCB 180 or coupled into thruholes 184 of the PCB 180 in any conventional manner. Thruholes 184 of the PCB 180 may be formed to include a bushing, a sleeve, via or other component.

With the module cage 170 mounted to the host PCB 180 and grounded to the system chassis during the system operation, the fiber optic (transmit/receive) module 100 hot-slides into and out of the module cage 170 through a front opening 176. The back 177 and sides 178–179 of the housing of the module cage are closed to provide EMI shielding. The beginning of the guide rails 162 of the fiber optic module 100 are inserted into guide rail slots 171 of the module cage 170. The remaining portion of the guide rails 162 slide along the guide rail slots 171 as the fiber optic module 100 is inserted into the module cage 170. At one point in insertion of the fiber optic module 100, the male electrical connectors 113 and 117 of the PCB 106 engage the female electrical connectors 181 and 182 respectively on the host PCB 180. With the fiber optic module 100 inserted into the module cage 170, the guide rails 162 of the PCB 106 couple to the guide rail slots 171 of the module cage in order to shunt electromagnetic fields from the shielded housing 119 through the guide rails 162, the guide rail slots 171, the tabs 175 and into the chassis ground.

While high frequency electronic components require shielding, low frequency electrical components and some passive components may not. Thus low frequency and passive electrical components of the fiber optic module 100, such as component 169 in FIG. 5A, can be located on the PCB 106 outside its shielding 119.

Figure 4B:
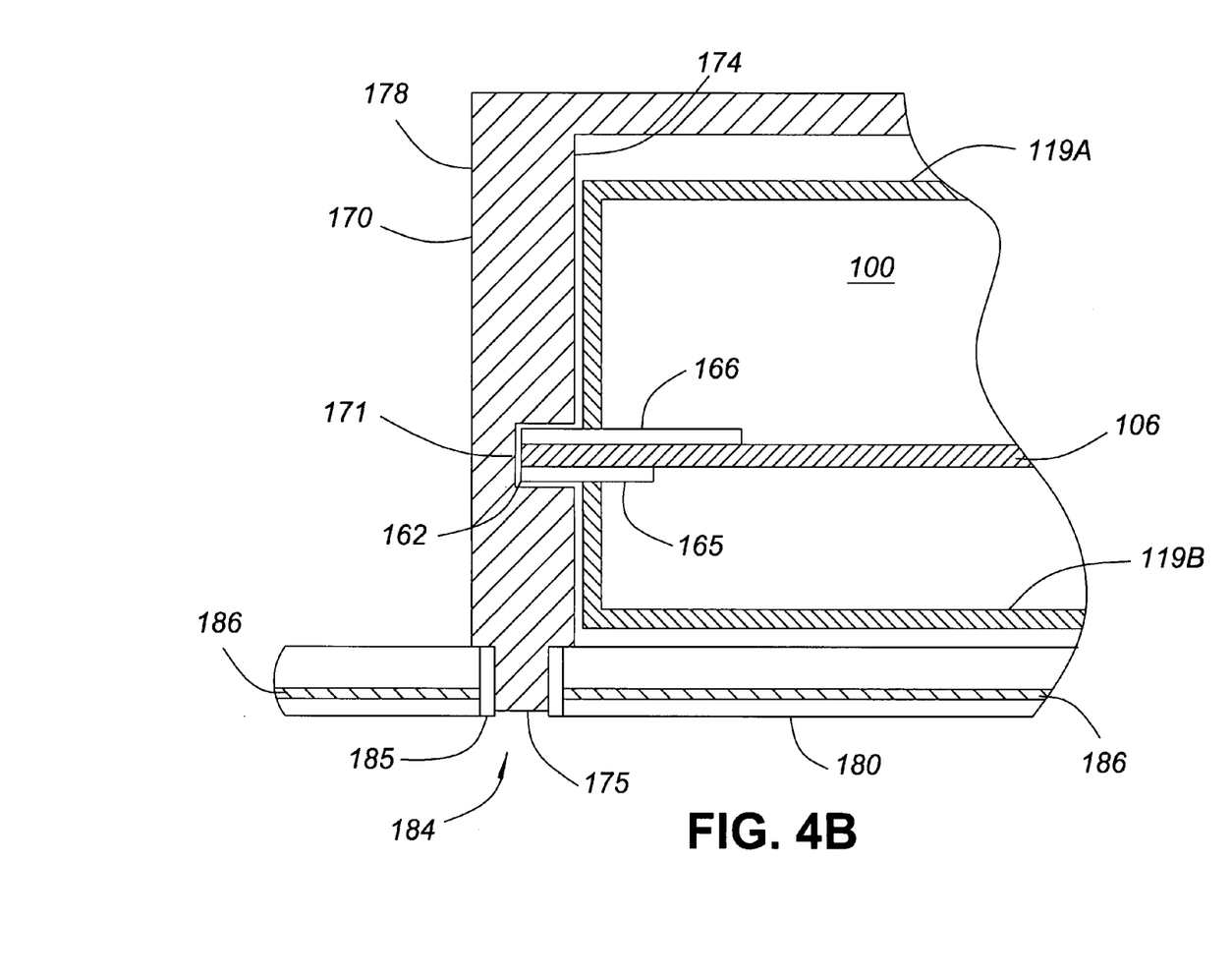
FIG. 4B is a magnified cross sectional view from the side of the fiber optic module, module cage and a printed circuit board of the present invention coupled together.

Referring now to FIG. 4B, a magnified cross-sectional view of the fiber optic module 100 inserted into the module cage 170 taken along section line 4B in FIG. 4A is illustrated. In FIG. 4B, the guide rail 162 is inserted into the guide rail slot 171 and are electrically and mechanically coupled together. The module cage 170 is preferably formed of a conductive material. In this case, the guide rail slots 171 are molded into the sides of the module cage as shown in FIG. 4B. The guide rail slots 171 are of a conductive material in order to make an electrical connection to the guide rails 162 of the fiber optic module 100.

As shown in FIG. 4B, each of the one or more guide rails 162 of the fiber optic module 100 may be formed on the PCB 106 by providing a conductive trace 165 on a bottom surface of the PCB 106 and/or a conductive trace 166 on a top surface of the PCB 106. The conductive traces 165–166 are preferably a metal such as copper, silver, gold or other metal or alloy. The top conductive trace 166 couples to the top portion 119A of the electromagnetic shield 119. The bottom conductive trace 165 couples to the lower portion 119B of the electromagnetic shield 119. The conductive traces 165–166 are ground traces which are a part of the ground plane 114 of the fiber optic module 100.

To alternatively form the conductive guide rail slots 171, an inner surface 174 of the module cage 170 can be coupled to a conductive metal shield or have a conductive material applied thereto. In any case, the conductive material of the module cage, inner surface 174 or metal shield couples to a chassis ground to shunt electromagnetic signals to ground.

The guide rails 162 of the PCB 106 and the guide rail slots 171 of the module cage 170 are of sufficient strength to support the weight of the fiber optic module 100.

Each guide rail slot 171 may include a retaining notch 173 which couples to the end of each guide rail 162 upon complete insertion of the fiber optic module 100 into the module cage 170. Removal of the fiber optic module 100 would then include lifting the fiber optic module 100 so that the end of the guide rail clears the retaining notch.

Pins of the male electrical connectors 113 and 117 couple to the female electrical connectors 181 and 182 respectively when the fiber optic module 100 is substantially inserted into the module cage 170. Because the guide rails 162 and guide rail slots 171 ground the fiber optic module 100 before power is coupled to the fiber optic module 100 via the electrical connectors, the module 100 will be hot pluggable in order to reduce down time.

Referring now to FIG. 5A, a cut-away top view of a locking mechanism for coupling together the fiber optic module 100, the module cage 170, and the host PCB 180 is illustrated. The locking mechanism includes a sliding arm 190, a rocker arm 192, a lever arm 195, and a cradle 197. With the fiber optic module 100 substantially coupled to the module cage 170 and the female electrical connectors 181 and 182, the sliding arm 190 is actuated by a user's finger pushing on its end to unlock and partially eject the fiber optic module 100 from the module cage 170. The rocker arm 192 includes a hook 191 at one end and a cam 193 at an opposite end. The hook 191 couples to an end point of the guide rail 162 of the fiber optic module to lock it in place. The sliding arm 190 includes a cutout 194 to interface with the cam 193 of the rocker arm 192. The cam 193 unlocks the fiber optic module 100 prior to its ejection when the cutout 194 pushes on the cam 193 to rotate the rocker arm 192 and unhook the hook 191 from the guide rail 162. The sliding arm 190 further includes a push tab 196 to couple to one end of the lever arm 195. As a user presses further on the end of the sliding arm 190 using his or her finger, the push tab 196 pushes on one end of the lever arm 195 to rotate it around a pivot point 198 in the cradle 197. The cradle 197 has fingers (not shown) that contact and engage the receiver printed circuit board 250 edge adjacent to the female electrical connectors 181 and 182. The cradle fingers push on the fiber optic module 100 so that it forcibly decouples male electrical connectors 113 and 117 of the fiber optic module 100 from the female electrical connectors 181 and 182 of the host PCB 180.

Figure 5B:
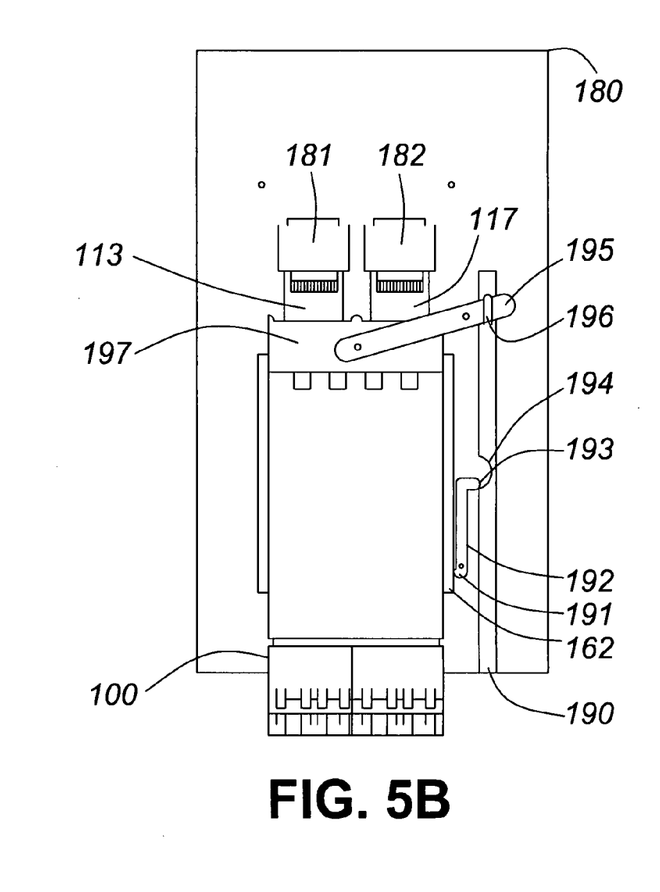
FIG. 5B is a top view of the locking mechanism of FIG. 5A in an unlocked/ejected position.

Referring now to FIG. 5B, the unlocked and ejected position of the fiber optic module 100 in relation to the module cage 107 and the host printed circuit board 180 is illustrated. To engage and lock the fiber optic module 100 in place, a user pushes on the LC connectors 161. As the fiber optic module 100, slides into the cage, the rear of the receiver printed circuit board 250 starts to contact the cradle fingers. This moves the cradle 197 toward the female electrical connectors 181 and 182. The sliding action of the cradle causes the lever arm 195 to rotate about the pivot point 198. The rotating lever arm 195 pushes out the sliding arm 190. The hook 191 on the rocker arm 192 slides against the moving fiber optic module 100 until the edge of the receiver printed circuit board 250 slides to the hook 191. Then the spring loaded rocker arm 192 rotates the hook 191 over the edge of the receiver printed circuit board 250 once the fiber optic module 100 is at the set engagement depth; this action physically prevents the fiber optic module 100 from being withdrawn from the host system. The male electrical connectors 113 and 117 engage the female electrical connectors 181 and 182 while the fiber optic module 100 is sliding into place. Electrical signals are sequentially engaged to prevent damage to either the host system or the module. Once the hook 191 on the rocker arm 192 locks into place, the electrical connectors are fully seated and complete the electrical functionality to the fiber optic module 100.

In operation of the fiber optic module 100, data may be received as electrical signals from pins of the male electrical connectors 113 for example or as optical signals through one or more fiber optic cables 101.

If data is received as electrical signals through pins of the male electrical connectors 113, the electrical components 112 of the fiber optic module 100 process the data to generate electrical transmission signals which are coupled into the transmitter 110 for transmission as optical signals over one or more fiber optic cables 101. Transmitter 110 convert the electrical transmission signals from the electrical components 112 into pulses of light as the optical signal.

Alternatively, if data is received as an optical signal from one or more fiber optic cables 101, the receivers 111 convert the pulses of light into electrical signals which are coupled to electrical components 116 of the fiber optic module 100. Electrical components 116 process the data to generate electrical received signals which are coupled to pins of the male electrical connectors 117. The electrical components 112 and 116 may be either analog, digital or a mixed analog/digital type of electrical components. The capabilities of electrical components 112 and 116 may include storing data, encoding data, decoding data, controlling the transmitting or receiving of data, power management, deskewing, and other capabilities well known in the art of transmitting and receiving signals by means of fiber optic modules.

In operation, electromagnetic fields may radiate to the EMI shield 153, the shielded housing 119, the ground plane 114 of the fiber optic module 100 as well as the module cage 170 and shields of the female electrical connectors 181 and 182.

Electromagnetic fields radiating to the module cage 170 are shunted through the chassis ground. Similarly, electromagnetic fields that radiate to or that are shunted to the shielded housing 119 are shunted to ground via the guide rail 162, the surface of the guide rail slot 171, and then via the chassis ground. The signal ground is connected to the male electrical connectors 113 and 117, and female electrical connectors 181 and 182. When plugged in, the signal ground is first connected to avoid any damage to the module before the signal is connected. In this way, the module can be hot-plugged in and out without introducing any damage to the module and the system.

The previous detailed description describes the fiber optic module 100 as including two or more receivers or two or more transmitters. However, one of ordinary skill can see that the fiber optic module 100 may include two or more combinations of a receiver and transmitter. One embodiment of the present invention includes four transmitters. Another embodiment includes four receivers. Yet another embodiment includes a combination of four transmitters and receivers. Additionally, the previous detailed description described one PCB board for receive and transmit functions. However, the present invention may be extended to a plurality of PCB boards placed side by side substantially in parallel to providing transmit or receive functionality or both into multiple channels of parallel fiber optic cables.

As those of ordinary skill will recognize, the present invention has many advantages over the prior art. One advantage of the present invention is that each channel can be separately monitored for power output and therefore individually optimized. Since the present invention does not depend on VCSEL arrays, another advantage is that the alignment between electrical elements and optical elements can be more easily performed using three dimensional alignment. Another advantage of the present invention is that spacing provided between fiber optic channels eases the attachment of heatsinks. Yet another advantage of the present invention is that the ample spacing between channels can reduce cabling termination costs of multiple channel connections. Another advantage of the present invention is that ample spacing between channels of the multiple channels allows the fiber optic module to meet FDA and IEC Class-1 eye safety limits. Another advantage of the present invention is that it minimizes electromagnetic interference by shielding high frequency electrical components.

The preferred embodiments of the present invention are thus described. While the present invention has been described in particular embodiments, the present invention should not be construed as limited by such embodiments, but rather construed according to the claims that follow below.

What is claimed is:

1. A fiber optic module slideable into and out of a cage with a slot, which is mounted on a host printed circuit board of a system chassis, for transmitting and/or receiving data, the fiber optic module comprising:
   a printed circuit board having high frequency electrical components mounted to a first surface, a pluggable electrical connector extending therefrom for insertion and removal from a corresponding electrical connector on the host printed circuit board, and a first ground plane formed on the first surface near a first edge;
   a plurality of fiber optic receptacles, the plurality of fiber optic receptacles coupled to the printed circuit board in parallel; and
   an electromagnetic interference shield coupled to the first ground plane of the printed circuit board, thereby covering the high frequency electrical components mounted to the first surface, and thereby forming a first guide rail out of the first edge of the printed circuit board;
   wherein the first guide rail is for sliding along the cage slot during insertion and removal of the pluggable electrical connector into and from the corresponding electrical connector, and for shunting electromagnetic fields from the electromagnetic interference shield, through the first guide rail and the cage slot to a ground of the system chassis.

2. The fiber optic module of claim 1, further comprising:
   an optical block, the optical block having a plurality of lenses, each of the plurality of lenses for coupling photons between a plurality of fiber optic cables coupled to the plurality of fiber optic receptacles and the fiber optic module.

3. The fiber optic module of claim 2, wherein the optical block has a plurality of optical ports each having a fiber ferule inserted therein for aligning the fiber optic cables to the plurality of lenses of the optical block.

4. The fiber optic module of claim 2, wherein the optical block has a plurality of openings, each of the plurality of openings facing each of the respective plurality of lenses on a second side, each of the plurality of openings having sufficient size to accept a transmitter or a receiver.

5. The fiber optic module of claim 4, further comprising:
   a plurality of transmitters coupled into the plurality of openings in the optical block, each of the plurality of transmitters including a vertical cavity surface emitting laser.

6. The fiber optic module of claim 4 further comprising:
   a plurality of receivers coupled into the plurality of openings in the optical block, each of the plurality of receivers including a photodiode.

7. The fiber optic module of claim 1, wherein the electromagnetic interference shield couples to the ground plane of the printed circuit board such that it covers the high frequency electrical components mounted to the first surface and forms a second guide rail near a second edge of the printed circuit board.

8. The fiber optic module of claim 7, wherein the electromagnetic interference shield sandwiches the printed circuit board; and wherein the first guide rail and the second guide rail extend outside the electromagnetic interference shield on opposites sides of the fiber optic module.

9. The fiber optic module of claim 1 further comprising:
   a processor coupled to the printed circuit board, the processor to control the transmitting, the receiving, or both the transmitting and receiving of data through at least one of the plurality of fiber optic receptacles.

10. The fiber optic module of claim 1, further comprising:
    the plurality of fiber optic receptacles is at least four fiber optic receptacles; and,
    the printed circuit board has a hot-pluggable connector to couple an electrical signal between the printed circuit board and an electrical device located off of the printed circuit board.

11. The fiber optic module of claim 10, wherein the fiber optic receptacles are LC receptacles.

12. The fiber optic module of claim 1, wherein the printed circuit board has an electrical component to convert signals between an electrical form and an optical form.

13. A fiber optic system for transmitting and/or receiving data, comprising:
    a fiber optic module having one or more guide rails extending therefrom electrically coupled to a ground plane of a printed circuit board and electrically coupled to an electromagnetic shield surrounding high frequency electrical components mounted to the printed circuit board, the fiber optic module further having a plurality of fiber optic receptacles at one end and one or more pluggable electrical connectors at an opposite end; and,
    a module cage mounted on a host printed circuit board of a system chassis, the module-cage having a housing with an open end to accept the fiber optic module, an electrical connector for receiving the pluggable electrical receiver of the fiber optic module's printed circuit board, and one or more guide slots on sides of an interior surface for slideably receiving the guide rails during insertion and removal of the pluggable electrical connector into and from the electrical connector of the module cage;
    wherein the one or more guide rails shunt electromagnetic fields from the electromagnetic interference shield, through the cage slots to a ground of the system chassis.

14. The fiber optic system of claim 13, further comprising:
    a lock mechanism, the look mechanism having
    a rocker arm with a hook to couple to a guide rail of the fiber optic module to look it in place, and
    a cam to couple to a cutout of a sliding arm and decouple the hook of the rocker arm from the guide rail of the fiber optic module.

15. The fiber optic system of claim 13, further comprising:
    an ejection mechanism, the ejection mechanism having
    a sliding arm having a first end and a second end, the sliding arm to slide in response to a force at the first end, and
    a lever arm with a cradle at a pivoting end, the cradle to couple to an end of the printed circuit board of the fiber optic module to push out and eject the fiber optic module, an opposite end of the lever arm coupled to the sliding arm to cause the lever arm to pivot about the pivoting end and eject the fiber optic module in response to the force at the first end of the sliding arm.

16. The fiber optic system of claim 13, wherein the module cage further has one or more tabs to electrically couple the one or more guide slots to the ground plane of the host chassis ground.

17. The fiber optic system of claim 13, wherein each of the one or more guide slots of the module cage has a flared opening to more easily accept the one or more guide rails of the fiber optic module.

18. The fiber optic system of claim 13, wherein the module cage is formed of a conductive material to provide another electromagnetic shield.

19. The fiber optic system of claim 13, wherein the fiber optic module is a fiber optic transmitter and the fiber optic transmitter has a processor to separately monitor the output optical power and adjust the transmitter of each communication channel in response to the measured output optical power in each respectively.

20. The fiber optic system of claim 13, wherein said fiber optic module and said module cage conform to a form factor of a Gigabit Interface Converter (GBIC) package.

21. The fiber optic system of claim 20, wherein said fiber optic receptacles are LC receptacles.

22. The fiber optic system of claim 13, further comprising:
   a lock mechanism coupled to the module cage, the lock mechanism having
      a rocker arm with a hook to couple to one of the guide rails of the fiber optic module to hold the fiber optic module and the module cage coupled together, and
      a cam to couple to a cutout of a sliding arm and decouple the hook of the rocker arm from the one of the guide rails of the fiber optic module; and,
   an ejection mechanism coupled to the module cage, the ejection mechanism including
      the sliding arm having a first end, a second end, and the cutout, the sliding arm to slide in response to a force at the first end, and
      a lever arm with a cradle at a pivoting end, the cradle to couple to an end of the printed circuit board of the fiber optic module to push out and eject the fiber optic module, an opposite end of the lever arm coupled to the sliding arm to cause the lever arm to pivot about the pivoting end and eject the fiber optic module in response to the force at the first end of the sliding arm.

23. The fiber optic system of claim 20, wherein said plurality of fiber optic receptacles is at least four fiber optic receptacles sized to conform to the form factor of a GBIC package to provide at least four channels of communication.

* * * * *

UNITED STATES PATENT AND TRADEMARK OFFICE
CERTIFICATE OF CORRECTION

PATENT NO. : 7,013,088 B1
APPLICATION NO. : 09/651140
DATED : March 14, 2006
INVENTOR(S) : Jiang et al.

Page 1 of 1

It is certified that error appears in the above-identified patent and that said Letters Patent is hereby corrected as shown below:

Col. 6, line 32 to 47, the paragraph starting with "Referring now to FIG. 4A, ….." and ending with "the sheilded housing 119." should read
--Referring now to Figure 3, an exploded view of the optical subassembly 103' of the preferred embodiment of the present invention is illustrated. The optical subassembly 103' includes a nose 151, fiber ferules 131, an alignment plate 153, which also helps shield EMI from leaking into or out of the module and the optical block 120. The optical block 120 aligns transmitters 110 or receivers 111 with its internal lenses 121 and 123. Alignment plate 153 has projections 156 which engage external notches 157 of the optical block near its edges. The projections couple into the external notches 157 so optical ports 159 of the alignment plate 153 align with the optical ports 129 and 130 of the nose 151. Alignment plate 153 is coupled to shielded housing 119 via projections 156 and shunts electromagnetic fields to shielded housing 119. The fiber ferules 131 can be inserted into the optical ports 129 and 130 upon assembly. Nose 151 further has one or more posts 164 over which one or more holes 158 in the EMI shield 153 can slide in order to align the nose 151, fiber ferules 131, the EMI shield 153 and the optical block 120 together.--

Col. 7, line 41, "module 100 has two" should read --100 has two--

Col. 7, line 42, "blocks 102 each" should read --blocks 120 each--

Col. 12, line 44, "the look mechanism" should read --the lock mechanism--

Col. 12, line 46, "to look it in place" should read --to lock it in place--

Signed and Sealed this

Seventh Day of November, 2006

JON W. DUDAS
*Director of the United States Patent and Trademark Office*